(12) United States Patent
Blasi et al.

(10) Patent No.: US 7,339,845 B2
(45) Date of Patent: Mar. 4, 2008

(54) MEMORY DEVICE

(75) Inventors: Gianluca Blasi, Vimercate (IT); Barbara Vese, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 38 days.

(21) Appl. No.: 11/319,799

(22) Filed: Dec. 27, 2005

(65) Prior Publication Data

US 2006/0171222 A1  Aug. 3, 2006

(30) Foreign Application Priority Data

Dec. 28, 2004  (IT) ........................... 2004A002535

(51) Int. Cl.
*G11C 7/00* (2006.01)

(52) U.S. Cl. ................. 365/203; 365/154; 365/205

(58) Field of Classification Search ............... 365/203, 365/154, 205, 230.03

See application file for complete search history.

(56) References Cited

U.S. PATENT DOCUMENTS 5,689,468 A * 11/1997 Ihara ........................ 365/203

* cited by examiner

*Primary Examiner*—Huan Hoang
(74) *Attorney, Agent, or Firm*—Lisa K. Jorgenson; Robert Iannucci; Seed IP Law Group PLLC (57) ABSTRACT

A memory device an array of memory cells, the array including word lines and bit lines. The memory device also includes managing logic for managing array reading operations that are carried out by executing a step of precharging the bit lines and a step of turning on the word lines. The managing logic includes a control block for generating a first enable signal of the precharge step and a second enable signal of the turning on step such that, within the same reading operation, the precharge and turning on steps are partially concurrent.

47 Claims, 4 Drawing Sheets

MEMORY DEVICE

BACKGROUND OF THE INVENTION

1. Field of the Invention

The present invention relates to semiconductor integrated circuits and particularly memory devices.

2. Description of the Related Art

A memory device (or core) is known to comprise an array of memory cells, a word decoder, sense amplifiers including input/output buffers for temporary storing the data read/written from/in the memory array and a control logic.

Traditionally, to read a digital datum contained in a cell of the memory array (e.g. a SRAM cell), the control logic sends enable signals to the word decoder such as to command the turning on of word lines relating to the cell to be read.

It should be observed that known memory devices provide a synchronization signal or clock signal external to the memory to activate the control logic. For example, this control logic starts the enable signals of the word decoder at a rising edge of the clock signal.

As is well known to those skilled in the art, the memory cell to be read comprises bit lines that are conventionally precharged at a reference voltage upon each read operation.

Whereby, after the word lines of the cell to be read have been turned on, a differential voltage signal is generated between the bit lines in the cell. This differential signal is caused by the discharge of one of them.

At a preset voltage value of the differential discharge signal, the input/output buffers are enabled to output the datum read by the memory.

After the datum has been outputted, another precharge of the cell bit lines is provided for preparing the memory for a subsequent read operation.

In this case, a new rising edge of the clock signal, corresponding to the subsequent reading operation, can activate the control logic only after this bit line precharge has finished.

Accordingly, the conventional memory devices have a too long cycle time (the time between two subsequent clock edges), i.e. they are too slow and inadequate in a number of applications.

BRIEF SUMMARY OF THE INVENTION

One embodiment of the present invention provides a memory device that allows overcoming the drawbacks of the conventional memory devices.

One embodiment of the invention is directed to a memory device that includes:

an array of memory cells, each cell including at least one word line and at least one bit line; and managing logic for managing reading operations for the array suitable to receive a handshake signal for starting said reading operations and carrying out a precharge step of the bit lines to bring them to a reference potential and a turning on step of the word lines for allowing access to the cells. The managing logic includes a control block for generating a first enable signal of the precharge step and a second enable signal of the turning on step such that, within the same reading operation, the precharge and turning on steps are partially concurrent.

BRIEF DESCRIPTION OF THE SEVERAL VIEWS OF THE DRAWINGS

The characteristics and advantages of the present invention will be understood from the detailed description below of an exemplary and non-limiting embodiment thereof, in relation with the annexed drawings, in which.

DETAILED DESCRIPTION OF THE INVENTION

Figure 1:
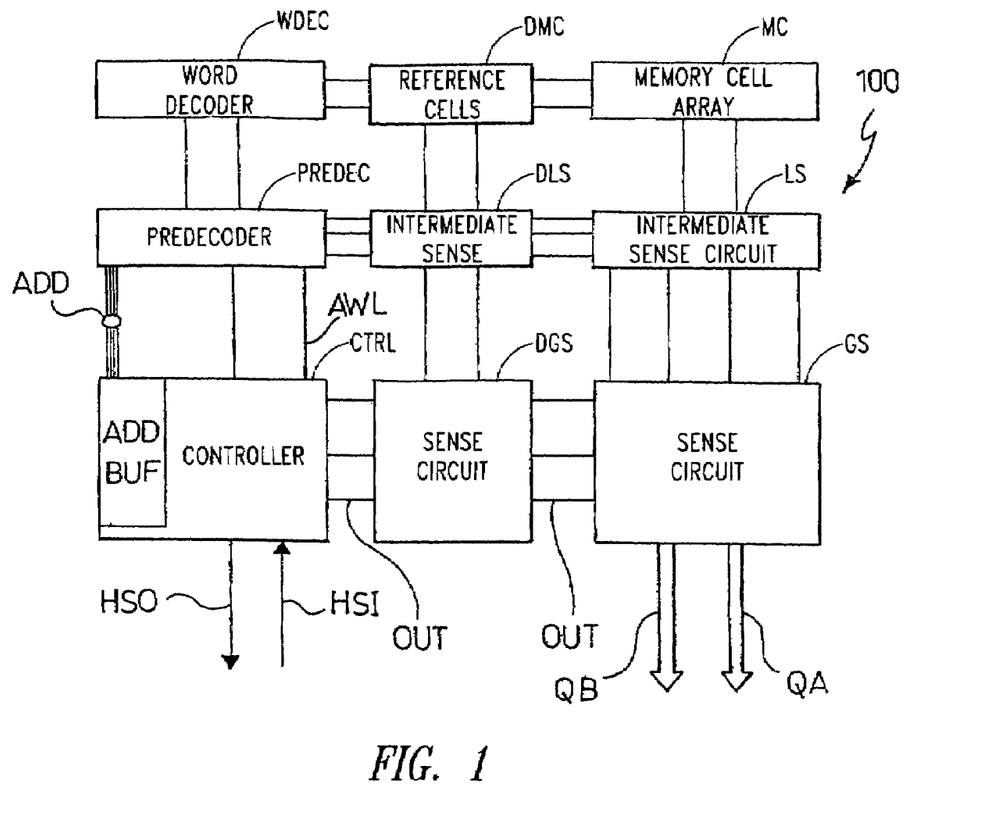
FIG. 1 shows a block diagram of a memory device in accordance with the invention.

A memory device, or core 100 of a semiconductor memory in accordance with one embodiment of the present invention is depicted in FIG. 1 by means of a block diagram.

Particularly, the memory device 100 comprises an array of memory cells MC, for storing digital data, a first block of sense circuits GS relative to the array MC and a word decoder WDEC. The first block of sense circuits GS includes input and output buffers for the digital data and is connected to the memory array MC through an intermediate block LS. This block LS is an intermediate level sensing block.

Furthermore, the memory device 100 comprises a block DMC of reference cells that are commonly called dummy cells. These dummy cells DMC are placed between the memory array MC and the word decoder WDEC. To the dummy cell block DMC there corresponds a second block of sense circuits DGS that is connected to the latter by means of a further intermediate sensing block DLS.

In addition, the memory device 100 comprises a control block or logic CTRL for enabling the read/write operations in/from the same memory array MC. In fact, the logic CTRL operates to provide enable commands AWL to the word decoder WDEC, through a predecode block PREDEC, and to provide further enable signals OUT to the sense circuits of the first GS and second DGS blocks.

Furthermore, the control logic CTRL comprises address buffers ADD BUF for storing addresses of the locations to be read (or written) in the memory array MC. Particularly, these addresses are provided to the predecode block PREDEC by means of an address bus ADD.

It should be observed that the control logic CTRL operates by exchanging first HSI and second HSO consensual synchronization signals or handshake signals with a memory interface device (not shown in FIG. 1). Both the first HSI and second HSO handshake signals can be asserted/deasserted between two logic levels.

Particularly, the first handshake signal HSI (handshake in), for example, when asserted, indicates the beginning of an access to the memory array MC, i.e. the beginning of the reading/writing of data from/in the memory array MC. In other words, this first signal HSI acts as a synchronization clock signal for the memory device 100.

Vice versa, the second signal HSO (handshake out) is generated by the control logic CTRL for being sent to the interface device. This second signal HSO, when it is deasserted, indicates that a reading/writing operation of a datum from/in the memory array MC has finished.

In other words, through the exchange of the handshake signals HSI and HSO with the interface device, the memory device 100 can operate in an asynchronous manner.

It will be assumed herein below that the cells of the memory array MC are SRAM cells, for example similar to the cell 200 depicted in FIG. 2.

As is well known to those skilled in the art, this cell 200 comprises first 201 and second 202 inverting devices or inverters that are connected to each other such that an input of the first inverter 201 is connected to an output of the second inverter 202 and vice versa. Furthermore, the cell 200 is connected to a first cell bit line BLL by means of a first N-type connection transistor 203 (or pass transistor) and is connected to a second cell bit line BLR by means of a second connection transistor 204 similar to the first one. This first 203 and second 204 pass transistors can be activated through first WL0 and second WL1 word lines, respectively.

It should be observed, particularly, that the pass transistors 203 and 204 can be activated independently from each other. Whereby, for example, during a read step of cell 200, a piece of binary information can be transferred from the cell 200 to the first bit line BLL independently from the information transferred to the second bit line BLR. In other words, the cell 200 of the memory array MC is provided with two output ports (the bit lines BLL and BLR) for the data and single-ended information is associated to each of these ports.

Consequently, the array MC is a two-port memory array.

Generally, the entire memory device 100 is provided with two ports that are illustrated in FIG. 1 by a first QA and second QB buses of digital data outputted from the first block of sense circuits GS. These first QA and second QB buses provide homonym digital data to the interface device.

As will be understood by those skilled in the art, by "data bus" is meant a plurality of electric lines, each carrying an indicative signal of one individual bit.

The digital data QA and QB are the contents of two distinct locations of the memory array MC.

While exemplary reference is made to a two-port memory device 100, the inventive device may also have more than two ports or be a one-port memory device.

Figure 3:
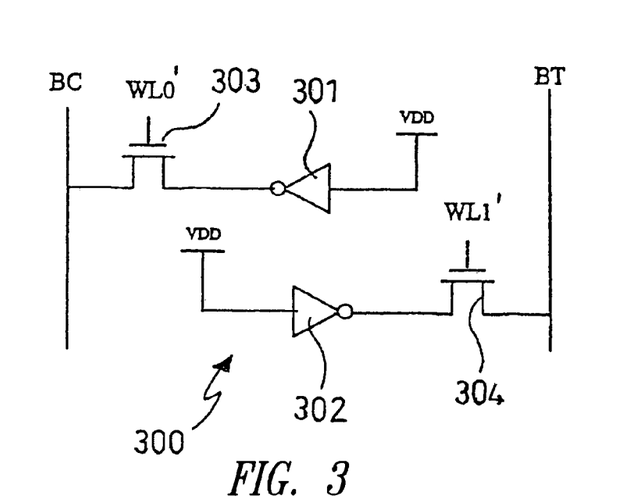
FIG. 3 shows a circuit diagram of a known reference cell comprised within the memory device of FIG. 1.

A reference cell, or dummy cell 300 for use in the memory device 100 of the invention is illustrated in FIG. 3.

Particularly, this dummy cell 300 comprises further first 301 and second 302 inverters having respective inputs that are connected to an electric potential of power supply VDD. Furthermore, respective outputs of the first 301 and second 302 inverters are connected to further dummy cell bit lines BC and BT by means of a further first 303 and a further second 304 pass transistors, respectively. Similarly, to the pass transistors 203 and 204 of the memory cell 200, the pass transistors 303 and 304 of the dummy cell can be activated by a further first WL0' and a further second WL1' word line, respectively.

It should be observed that the block DMC of dummy cells from FIG. 1 comprises a column of cells similar to cell 300 and connected to each other by means of the further bit lines BC and BT.

In addition, each cell 300 of the block DMC is relative to a line of the memory array MC. Accordingly, the further word lines WL0' and WL1' of the dummy cell 300 relative to the line in which the memory cell 200 is placed coincide with the word line WL0 and WL1.

Figure 4:
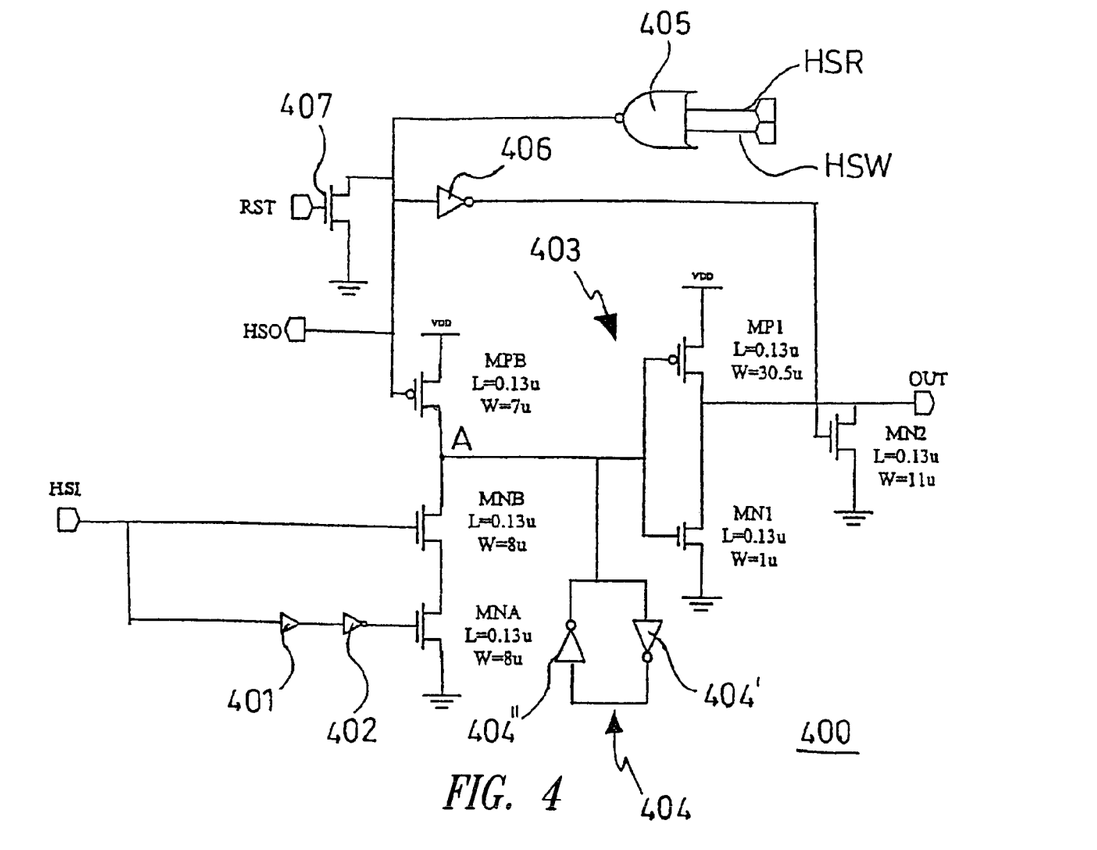
FIG. 4 shows a handshake circuit included within the memory device of FIG. 1.

The control logic CTRL of the memory device 100 comprises handshake circuitry 400, the scheme of which is illustrated in FIG. 4.

It should be observed that this handshake circuitry 400 comprises a plurality of electronic devices that operate in a digital manner and are provided to be integrated on a chip of a semiconductor material.

Particularly, the circuit 400 comprises first MNA and second MNB input transistors of the NMOS type (N metal-oxide-semiconductor). The first transistor MNA has a source terminal connected to a ground potential and a drain terminal connected to a source terminal of the second transistor MNB.

In addition, gate terminals of the transistors MNA and MNB can be controlled by means of the first handshake signal HSI. In greater detail, the gate terminal of the second transistor MNB can be directly controlled by said signal HSI, whereas the gate terminal of the first transistor MNA can be controlled by the signal HSI through a buffer device 401 and an inverter 402.

As is well known to those skilled in the art, the buffer device 401 introduces a delay on the first handshake signal HSI to be sent to the inverter 402.

It should be observed that the transistors MNA and MNB have the same dimensions, i.e. they have the same channel length L and width W. For example, for both transistors: $L=0.13$ μ and $W=8$ μ.

Furthermore, a drain terminal of the second input transistor MNB is connected, at the same time, to a drain terminal of a transistor MPB of the PMOS type, to a first holding device 404 and an output inverter 403 of the circuit 400.

Particularly, as shown in FIG. 4, the electric connection made between the drain terminals of the transistors MNB and MPB, an input terminal of the inverter 403 and the holding device 404 detects an electric node of the circuit 400 that is designated with A. This node A corresponds to the input terminal of the output inverter 403.

As is well known to those skilled in the art, the first holding device 404, also called soft-latch, comprises two inverters 404' and 404" that are feedback-connected to each other.

Furthermore, the output inverter 403 comprises a first MN1 and a second MP1 transistors that are connected to each other in a CMOS configuration, i.e. having the respective gate terminals connected to the node A and the respective drain terminals connected to an output terminal OUT corresponding to the output of the handshake circuit 400.

On the output terminal OUT there is provided a logic signal homonym enabling the sense circuits of the first GS and the second DGS blocks.

In addition, the source terminals of the transistors MN1 and MP1 are connected to the ground potential and the electric potential VDD, respectively.

It should be observed, particularly, that the transistors MN1 and MP1 have different dimensions since, though having the same channel length L (e.g. of 0.13 μ), they have a different channel width W. In fact, the channel width W of the transistors MN1 and MP1 is, for example, of 1 μ and 30.5 μ, respectively.

As a consequence of the different dimensions of the transistors MN1 and MP1, as is well known to those skilled in the art, the output inverter 403 has a logic threshold of about $V_{LT}$=VDD−200 mV, i.e. the output terminal OUT of the inverter 403 quickly switches from a logical 0 to a logical 1.

In addition, the PMOS transistor MPB, made for example with L=0.13 μ and W=7 μ, has a source terminal connected to the electric potential of supply VDD and a gate terminal connected to an output of a logic NOR gate 405 having two inputs.

As illustrated in FIG. 4, the output of the logic NOR gate 405 is the second handshake signal HSO obtained in response to a read-end signal HSR applied to one of the inputs of the NOR gate 405. Equivalently, at the other input of the NOR gate 405 a write-end signal HSW is applied.

Furthermore, a further output transistor MN2 of the NMOS type has a drain terminal connected to the output terminal OUT of the handshake circuit 400 and a source terminal connected to the ground potential.

A gate terminal of this transistor MN2 can be controlled by the output of the logic NOR gate 405 through a further inverter 406. For example, the dimensions of the NMOS transistor MN2 are L=0.13 μ and W=11 μ. Particularly, this transistor MN2 when activated is such as to bring the output terminal OUT of circuit 400 to the ground potential.

Finally, the handshake circuit 400 comprises a reset NMOS transistor 407 having a drain terminal connected to the output of NOR gate 405 and a source terminal connected to ground. This transistor can be activated by asserting a reset signal RST to fix the second handshake signal HSO to the ground potential, i.e. to fix a stand-by value at the beginning of an access cycle to the memory device 100 (power on).

Figure 5:
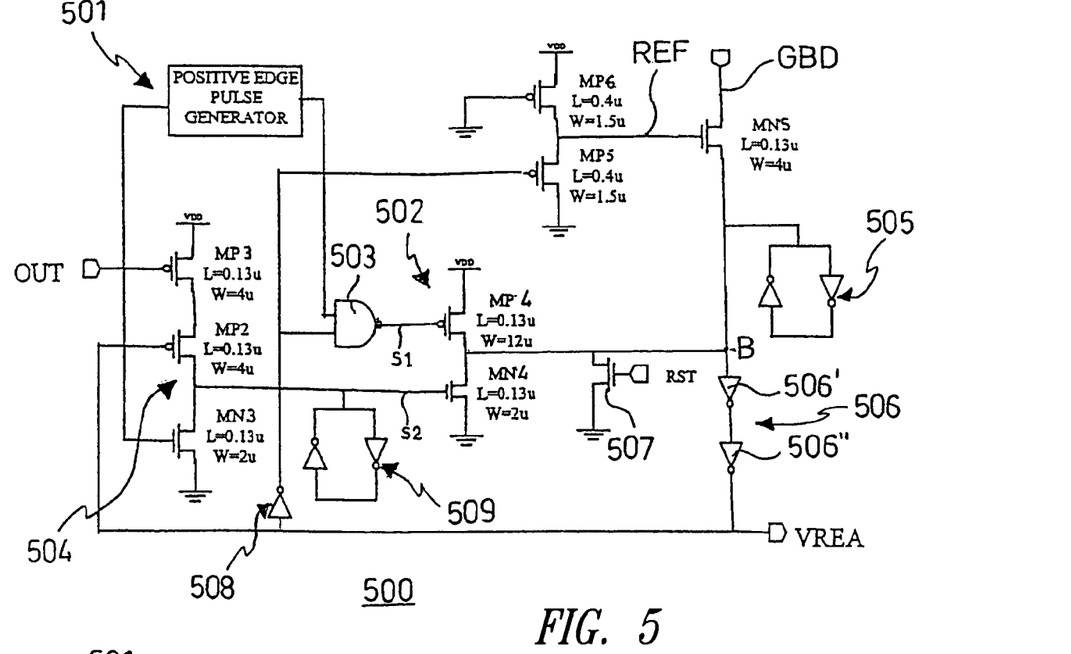
FIG. 5 shows a sense circuit relative to reference cells which is comprised within the memory device of FIG. 1.

It should be noted that each bit line BC and BT of the dummy cell column of the dummy block DMC can be associated with a sense circuit or sense 500 of the second block DGS, the circuit scheme thereof being illustrated in FIG. 5.

Figure 6:
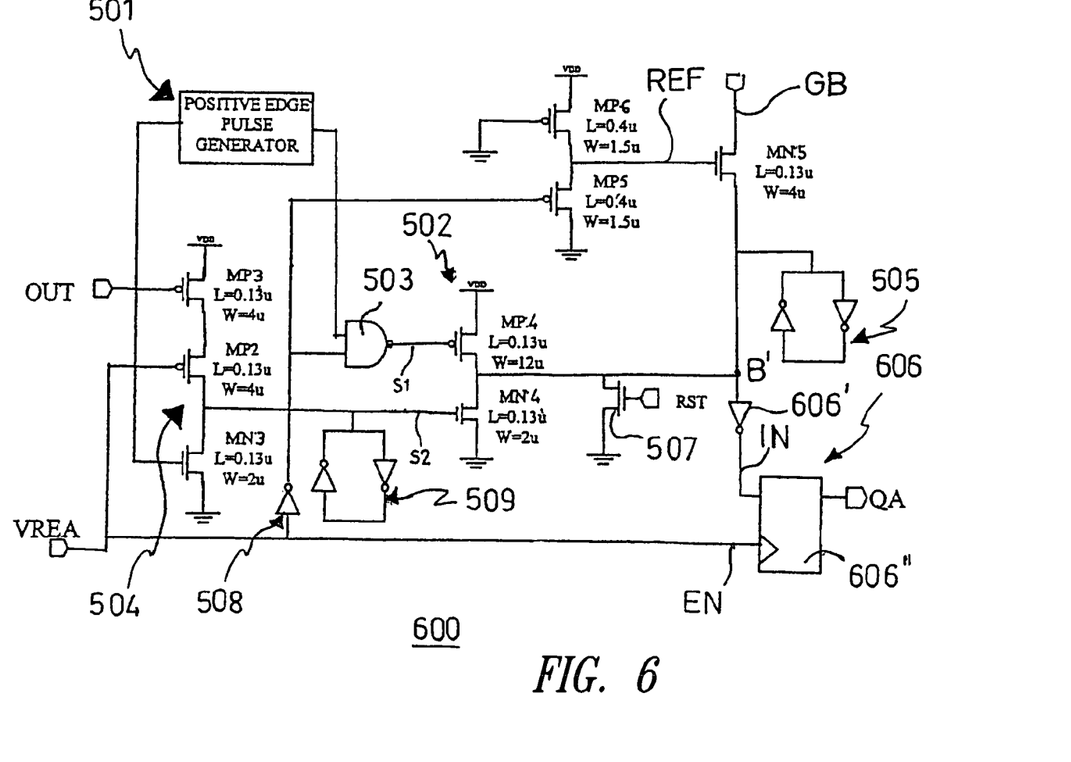
FIG. 6 shows a sense circuit relative to memory cells which is comprised within the memory device of FIG. 1.

Similarly, each bit line BLL and BLR of cells of the memory array MC can be associated with a further sense circuit or sense 600 comprised in the first block GS, the circuit scheme thereof being illustrated in FIG. 6.

Particularly, the sense 500 comprises an input functional block 501 acting as a positive edge pulse generator such as to generate pulse edges in response to the enable signal OUT. This input block 501 is output-connected to a first input of a two-input NAND logic gate 503.

This NAND gate 503 is output-connected, in turn, to an intermediate precharge stage 502 for precharging/discharging an output line or global bit line GBD relative to the dummy cell column. In other words, the global bit line GBD can be selectively associated with one of the bit lines BC or BT of the dummy cells through the further intermediate sensing block DLS.

In greater detail, the intermediate stage 502 comprises a PMOS precharge transistor MP4 (L=0.13 μ and W=12 μ) of the global bit line GBD. This transistor MP4 has a gate terminal connected to the output of the NAND 503 and a source terminal connected to the electric potential VDD.

In addition, this intermediate stage 502 comprises a NMOS discharge transistor MN4 (L=0.13 μ and W=2 μ) of the global bit line GBD. This transistor MN4 has a source terminal connected to the ground potential and a drain terminal connected to a drain terminal of the transistor MP4.

The drain terminals of MP4 and MN4 are an output of the intermediate stage 502 and are electrically connected to the global bit line GBD through a pass-transistor MN5 (L=0.13 μ and W=4 μ).

Furthermore, the output of the intermediate stage 502 is connected to an output stage 506 of sense 500. Particularly, as illustrated in FIG. 5, the electrical connection between the output of the intermediate stage 502, the output stage 506 and the pass transistor MN5 detects a node B of the amplifier 500.

Particularly, the output stage 506 comprises further inverters 506' and 506" that are series-connected between the node B and a further output terminal of sense 500. On the latter output terminal there is provided a validation signal (or strobe signal) VREA.

Furthermore, a second holding device 505 (similar to the first device 404 from FIG. 4) is connected to the node B at the pass transistor MN5.

In addition, a further NMOS reset transistor 507, that can be controlled through the reset signal RST, is connected to the node B such as to be parallel to the transistor MN4.

As illustrated in FIG. 5, the strobe signal VREA can be fed back through first 508 and second 504 feedback circuits.

Particularly, the first feedback circuit 508 comprises an inverter, the output thereof controlling (i.e. is electrically connected to) both a second input of the NAND logic gate 503 and a gate terminal of a PMOS transistor MP5 (L=0.4 μ and W=1.5 μ). Drain and source terminals of the transistor MP5 are connected to the ground potential and a drain terminal of a PMOS transistor MP6 which conducts (L=0.4 μ and W=1.5 μ), respectively. In addition, gate and source terminals of the latter transistor MP6 are connected to the ground potential and the electric potential VDD.

It should be noted that the pass transistor MN5 connected to the global bit line GBD can be activated through a reference potential REF provided on the drain terminal of this transistor MP6.

With reference to FIG. 5, the second feedback circuit 504 comprises a NMOS transistor MN3 (L=0.13 μ and W=2 μ) that can be controlled by means of the logic enable signal OUT and having a source terminal connected to the ground potential. This transistor MN3 is connected by means of a drain terminal to first MP2 (L=0.13 μ and W=4 μ) and second MP3 (L=0.13 μ and W=4 μ) PMOS load transistors serially connected to each other. Particularly, the first transistor MP2 can be controlled through the strobe signal VREA, whereas the second transistor MP3 can be controlled through the enable signal OUT.

It should be noted that a gate terminal of the discharge transistor MN4 of the global bit line GBD is electrically connected to the drain terminal of transistor MN3. In other words, the transistor MN4 can be controlled through an output of the second feedback circuit 504.

Finally, this output is also connected to a third holding circuit 509 (similar to those described above).

It should be noted that the two-port memory device 100 (being designated with QA and QB) provides a further strobe signal VREB in addition to the strobe signal VREA. This further strobe signal VREB is generated similarly as said signal VREA by means of a sense relative to the dummy cell column which is completely similar to the sense 500 described with reference to FIG. 5.

Furthermore, the strobe signal VREA (such as the further signal VREB) is the input signal for at least one of the further senses 600 included in the first block GS. Particularly, these further senses 600 are relative to one of those memory cell bit lines BLL or BLR indicated (FIG. 6) as the further output line or further global bit line GB.

It should be noted that this further global bit line GB can be selectively associated to the bit line BLL or BLR by means of the intermediate sensing block LS.

It should be observed that the circuit structure of the further sense 600 is substantially similar to that of sense 500 and the elements in common to each other are designated with the same reference numerals in FIGS. 5 and 6.

The circuit structures are only different in their output stages. In fact, the sense 600 comprises a further output stage 606 different from the output stage 506 of sense 500.

In greater detail, the output stage 606 comprises an inverter 606' and a D-type flip-flop 606". As shown in FIG. 6, the inverter 606' acts to invert the logic level of a digital signal present at a node B' (similar to the node B of sense 500) and to transfer the same to an input terminal IN of the flip-flop 606".

Advantageously, the strobe signal VREA control an enable terminal EN of the flip-flop 606" to output a read bit QA (logical 1 or 0).

It should be appreciated that the sizes and types of the transistors could be changed without departing from the present invention.

An example of operation of the memory device 100 can be described in relation with the FIGS. 1-7.

Particularly, reference is made to the reading from the memory array of a digital datum QA which is subsequently outputted by the device 100 on the homonym bus. In fact, generally, this datum QA comprises a plurality of bits each of which can be read at a cell 200 of the array MC through the bit line BLL or the bit line BLR.

It should be noted that under static conditions, i.e. between two subsequent accesses to the memory device 100, the first HSI and second HSO handshake signals of the handshake circuit 400 of the control logic CTRL take the logical values 0 and 1, respectively.

Furthermore, the potential of the node A is equal to the electric potential supply VDD, i.e. it is a logical 1, whereas the output terminal OUT is fixed to the ground potential (logical 0).

The deasserted first handshake signal HSI (logical 0) activates the first input transistor MNA through the buffer 401 and the inverter 402.

At a rising edge of the first handshake signal HSI (switching from logical 0 to 1) the second input transistor MNB is activated.

It should be noted that the simultaneous activation of the first MNA and second MNB input transistors tends to discharge the node A from the potential VDD to the ground potential, i.e. from logical 1 to logical 0. This discharge step has the same duration as the propagation time of the rising edge of the first handshake signal HSI towards the gate terminal of the first transistor MNA passing through the buffer 401 and inverter 402. In fact, a falling edge of the signal provided on the gate terminal of the transistor MNA (corresponding to the rising edge of HSI) tends to turn off this transistor thereby ending the discharge of node A.

At the end of this discharge step, a signal at low logical level (logical 0) is present on node A which is held as such by the first holding circuit 404.

It should be noted that the output OUT of the inverter 403 quickly switches from logical 0 to 1 already when the potential of node A decreases, such as by 100-200 mV relative to the potential VDD as a consequence of the dimensions L and W selected for the transistors MP1 and MN1. In fact, in these conditions, the transistor MP1 quickly turns on thereby bringing the output terminal OUT to the potential VDD.

Figure 7:
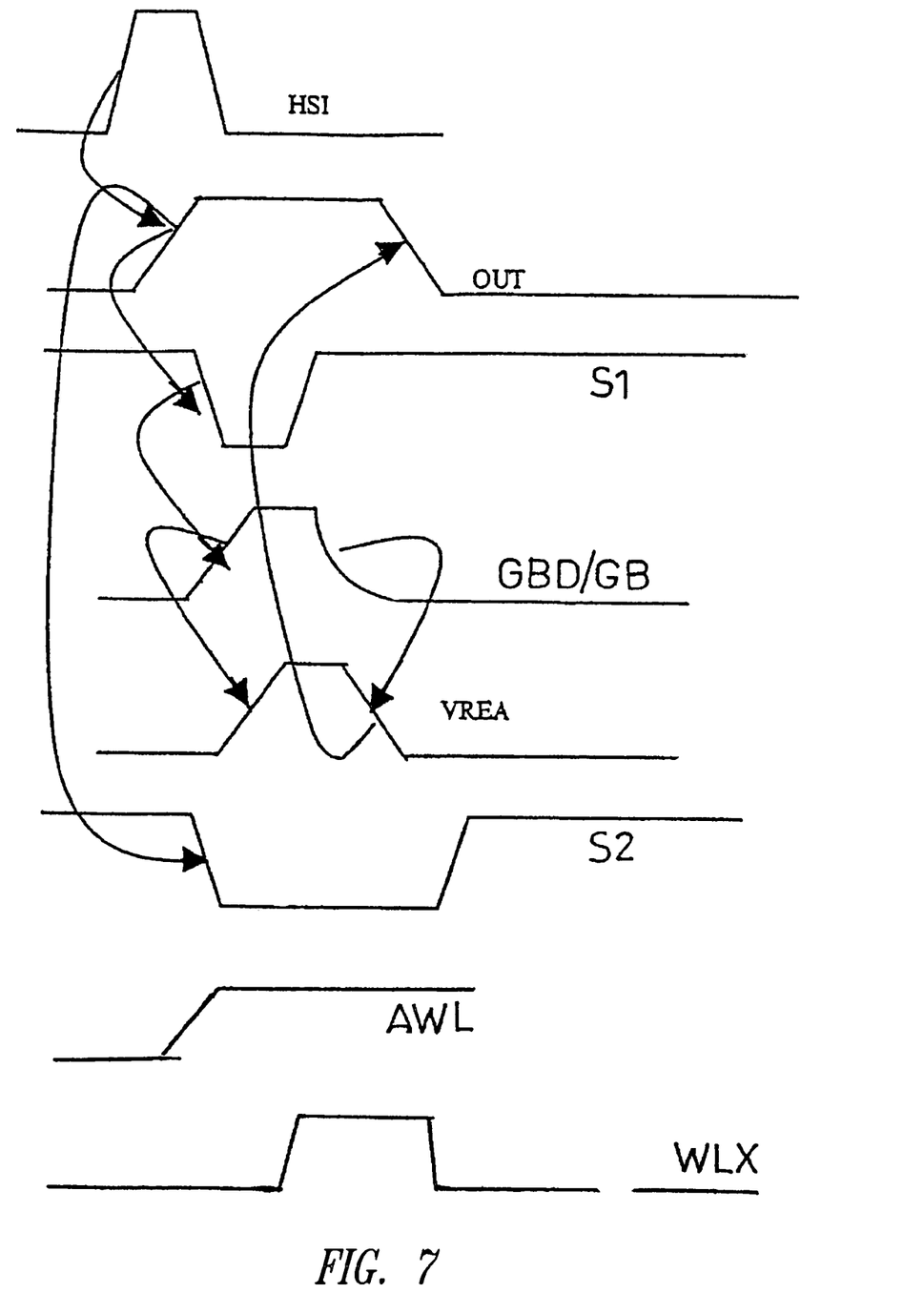
FIG. 7 shows timing diagrams of signals involved in the operation of the memory device of FIG. 1.

In other words, such as illustrated in FIG. 7, in response to the rising edge of the first handshake signal HSI, the control logic CTRL generates a rising edge (switching from logical 0 to logical 1) of the enable signal OUT.

At the rising edge of the enable signal OUT, the control logic CTRL activates the senses 500 relative to the column of dummy cells DMC and the further senses 600 corresponding to the bit lines BLL or BLR of the cell/s 200 to be read in the memory array MC.

Furthermore, the control logic CTRL sends the enable command AWL and addresses to the predecode block PREDEC and to word decoder WDEC to turn on (with a WLX pulse) the word lines WL0 or WL1 relative to the cell/s 200 of the memory array MC and the corresponding dummy cells 300.

At the sense 500 from FIG. 5, the rising edge of the enable signal OUT activates the positive pulse edge generator 501. The pulse provided by the generator 501 produces a falling edge of a first logical signal S1 generated on the output of the NAND gate 503.

Furthermore, the edge of the enable signal OUT turns the NMOS transistor MN3 of the second feedback circuit 504 thereby a falling edge of a second signal S2 is generated on the gate terminal of the transistor MN4.

Accordingly, the discharge transistor MN4 of the intermediate stage 502 is deactivated, whereas the corresponding precharge transistor MP4, which is activated by the first logical signal S1, determines the precharge of the node B at the electric potential VDD (logical 1).

It should be noted that, with the pass transistor MN5 activated by means of the transistor MP6 which conducts, the precharge of node B corresponds to the precharge at the potential VDD of the corresponding global bit line GBD, i.e. the bit lines BC or BT of dummy cell (FIG. 7). This precharge is designated in FIG. 7 by means of a precharge signal homonym of the global bit line GBD.

In other words, during the precharge step, to the falling edge of the first logical signal S1 corresponds a rising edge of the precharge signal of the global bit line GBD and a rising edge of the strobe signal VREA at the output of sense 500.

At the end of the precharge step, the node B takes the potential VDD corresponding to a high logical level (logical 1) that is held through the second holding circuit 505. This potential VDD of the node B is transferred to the output of sense 500 as a strobe signal VREA through the output stage 506.

It should be noted that the precharge step of all further global bit lines GB corresponding to the bit lines BLL or BLR of the memory cells 200 is carried out through the corresponding further senses 600 similarly to what has been described for the precharge of the global bit lines GBD.

In addition, with reference to FIGS. 5 and 6, the strobe signal VREA equal to a logical 1 deactivates the transistor MP4 that precharges the global bit line GBD (or GB) through the first feedback circuit 508. In fact, a logical 0 at the output of the inverter 508 determines the switching of the output of the NAND gate 503, i.e. the switching of the first signal S1 from logical 0 to logical 1, thereby deactivating the precharge transistor MP4.

Advantageously, the strobe signal VREA equal to logical 1 indicates that the precharge step of the global bit line GBD (and GB) has finished, i.e. it is a piece of information generated within the same memory device 100 relative to the end of the precharge step.

Figure 2:
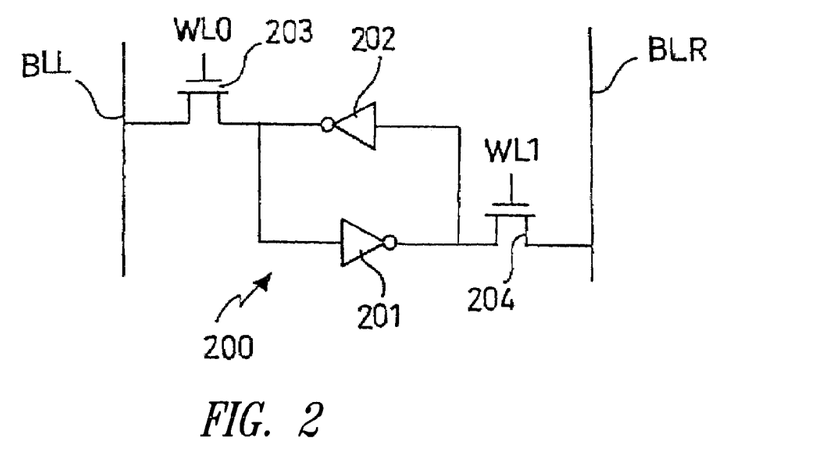
FIG. 2 shows a circuit diagram of a memory cell comprised within the memory device of FIG. 1.

As is well known to those skilled in the art, the SRAM memory cell 200 from FIG. 2 can be read through the first BLL or second BLR bit lines by activating the pass transistors 203 or 204, respectively, i.e. by turning on the first word line WL0 or the second word line WL1. When one of the word lines WL0, WL1 is turned on, one of the further pass transistors 303 or 304 of the dummy cell 300 being placed on the same line as the memory cell 200 is also simultaneously activated.

Advantageously, in the memory device 100, turning on the word lines WL0, WL1 is carried out when the precharge step of the global bit lines GBD and GB has finished.

For example, let us suppose to turn on the word line WL0 relative to the memory cell 200 to be read and to the corresponding dummy cell 300.

With reference to the dummy cell 300 as shown in FIG. 3, the output of the inverters 301 and 302 is always a logical 0. Therefore, upon turning on the word line WL0, the bit line BC, precharged to the potential VDD through the corresponding sense 500, is discharged at the ground potential (logical 0).

As shown in FIG. 7, the discharge of bit line BC (i.e. of the global bit line GBD) determines a falling edge of the strobe signal VREA at the sense 500, i.e. a switching of this signal from logical 1 to logical 0.

With reference to the SRAM cell 200 from FIG. 2, it should be observed that upon turning on the word line WL0, the bit line BLL (precharged at VDD) is discharged if the output of the inverter 202 is fixed at logical 0, whereas it remains at the precharge potential VDD if it is a logical 1.

Accordingly, the corresponding global bit line GB is discharged or holds the precharge potential, and transfers such information to the input terminal IN of the flip-flop 606" of sense 600.

It should be noted that at the falling edge of the strobe signal VREA, the flip-flop 606" is enabled to provide the bit read by the cell 200, i.e. the datum QA.

Advantageously, the falling edge of the strobe signal VREA indicates the availability of the data read on one of the output gates (QA) of the memory device 100.

At the falling edge of the strobe signal VREA, the memory device 100 provides that the reading-end signal HSR is sent to the control logic CTRL to generate a negative edge of the second handshake signal HSO outputted from the NOR logic gate 405. During the reading operation the signal HSW is always fixed at logical 0.

This second handshake signal HSO turns on the PMOS transistor MPB and brings the node A back to the potential VDD. Furthermore, this signal HSO also turns on (through the inverter 406) the NMOS transistor MN2 having a greater size than the transistor MN1 of the output inverter 403. Thereby, the switching of the output terminal OUT towards the ground potential (logical 0) is made faster.

It should be noted that at the falling edge of the second handshake signal HSO the reading operation can be considered as finished.

Furthermore, it should be noted that, as described above, while reading, the global bit lines GBD connected to the dummy cell column DMC are always discharged, whereas the further global bit lines GB connected to the memory MC can be either discharged or hold the precharge potential.

Advantageously, the second feedback circuit 504 of the senses 500 and 600 ensures the discharge at the ground potential of all the global bit lines GBD and GB at the end of each reading operation.

In fact, at the falling edge of the strobe signal VREA and that of the enable signal OUT, the transistors PMOS MP2 and MP3 of the second feedback circuit 504 are activated, respectively. Consequently, a rising edge of the second signal S2 is generated, which enables the NMOS discharge transistor MN4 of the global bit lines GBD and GB.

The memory device 100 is advantageous as compared with the conventional memory devices.

In fact, in this device 100, upon a reading operation, the precharge of the cell bit lines is carried out in a time period that is partially concurrent with the turning on-time of the relative word lines and no longer at the end of the reading operation.

Thereby, the memory device 100 has a shorter cycle time than the cycle times of the conventional devices and accordingly results faster than the latter.

Furthermore, the memory device 100 is circuitally prepared for operation with the edges and not with the levels of the signals. That is, the rising and falling edges of the signals involved in operating the device 100 supply different information.

For example, a 0 to 1 edge of the first handshake signal HSI indicates the beginning of a reading operation, whereas a consequent 1 to 0 edge of the second handshake signal HSO indicates the end of this operation. It should be observed that the falling edge of the second signal HSO is a precise measure of the cycle time of the device 100.

By using the dummy cells column DMC the suitable reference signals (strobe signals VREA) can be generated for the memory device 100 to operate in a proper manner. In fact, the strobe signal VREA samples (by enabling the flip-flop 606") the read data without requiring to fix margins and regardless of the size of the memory to be read.

Advantageously, the memory device 100 is configured such that it can be adapted to the variations in the number of lines and/or columns of the memory array MC, thereby it can be called a "generator" of memory devices.

Furthermore, since the bit lines of the memory MC are at the ground potential in stand-by conditions, the corresponding leakage currents are minimized.

In addition, by precharging and subsequently discharging the bit lines upon each reading operation, the energy consumption while reading is reduced.

It should be observed that the handshake circuit 400 of the control logic CTRL has the least capacitive effects at the input of signal HSI. Furthermore, a minimum number of gates between said signal HSI and the enable signal OUT entails minimum delays in the propagation of signal HSI.

Obviously, to the memory device of the present invention, those skilled in the art, aiming at satisfying contingent and specific requirements, will be able to carry out further modifications and variations, which are all contemplated within the scope of protection of the invention, such as defined in the claims below.

All of the above U.S. patents, U.S. patent application publications, U.S. patent applications, foreign patents, foreign patent applications and non-patent publications referred to in this specification and/or listed in the Application Data Sheetare incorporated herein by reference, in their entirety.

The invention claimed is:

1. A memory device comprising:
an array of memory cells, the array comprising a plurality of word lines and a plurality of bit lines; and
means for managing reading operations for the array suitable to receive a handshake signal for starting said reading operations and carrying out a precharge step of the bit lines to bring them to a reference potential and a turning on step of the word lines for allowing access to the cells, wherein said managing means include a control block for generating a first enable signal of the precharge step and a second enable signal of the turning on step such that, within the same reading operation, the precharge and turning on steps are partially concurrent, wherein the control block comprises a handshake circuit for generating a first edge of the first enable signal starting from said handshake signal.

2. The memory device according to claim 1, wherein said handshake circuit generates the first edge of the first enable signal from an edge of the handshake signal indicating that the reading operation has started.

3. The memory device according to claim 2, wherein said handshake circuit is such to generate a second edge of the first enable signal from an edge of a signal indicating that the reading operation has finished.

4. The memory device according to claim 1, wherein the control block is configured such that an edge of the second enable signal is at least partially activated during said precharge step, said second signal being such as to turn on the word lines at least after the precharge step has finished.

5. The memory device according to claim 1, wherein the handshake circuit is such as to generate said first edge of the first enable signal through the switching of an inverter element and said second edge of the first enable signal through the switching on of a transistor.

6. The memory device according to claim 1, wherein the cells of said array are cells that are read in single-ended mode.

7. The memory device according to claim 1, wherein the cells are SRAM cells.

8. The memory device according to claim 1 wherein the memory device is a memory device generator.

9. A memory device comprising:
an array of memory cells, the array comprising a plurality of word lines and a plurality of bit lines; and
means for managing reading operations for the array suitable to receive a handshake signal for staring said reading operations and carrying out a precharge step of the bit lines to bring them to a reference potential and a turning on step of the word lines for allowing access to the cells, wherein said managing means include a control block for generating a first enable signal of the precharge step and a second enable signal of the turning on step such that, within the same reading operation, the precharge and turning steps are partially concurrent, wherein the managing means comprise a first sense circuit provided with a first input line to receive said first enable signal and a first output line that is selectively connected to the bit lines to bring them to said reference potential by means of a precharge signal.

10. The memory device according to claim 9, wherein the first sense circuit is such that the precharge signal is activated starting from said first edge of the enable signal.

11. The memory device according to claim 10, wherein the first sense circuit is provided with a second input line to receive a strobe signal such that the precharge operation is interrupted while the precharge signal is maintained constant.

12. The memory device according to claim 11, wherein said first sense circuit comprises:
an input stage connected to said first input line;
a precharge/discharge stage that is electrically connected to said output line, said precharge/discharge stage imposing a discharge of the output line at the end of the reading operation;
a first output stage electrically connected to the output line for providing a datum read by said array during the reading operation and after the precharge step.

13. The memory device according to claim 12, wherein said input stage comprises a block generating positive pulse edges and a two-input NAND logic gate.

14. The memory device according to claim 12, wherein said precharge/discharge stage comprises a PMOS transistor and an NMOS transistor.

15. The memory device according to claim 12, wherein said first output stage comprises a flip-flop having an input terminal connected to the output line by means of an inverter and having an enable terminal that is controlled through the strobe signal to supply the read datum.

16. The memory device according to claim 9, wherein said array comprises a first subarray of reference cells and a second subarray of memory cells, said second subarray being connected to the first sense circuit.

17. The memory device according to claim 16, wherein said first subarray is connected to a second sense circuit included in said managing means.

18. The memory device according to claim 17, wherein the second sense circuit is provided with a respective first input line to receive said first enable signal and a respective first output line that can be selectively connected to the bit lines of the first subarray to bring them to said reference potential by means of a respective precharge signal.

19. The memory device according to claim 18, wherein the first sense circuit is provided with a second input line to receive a strobe signal such that the precharge operation is interrupted while the precharge signal is maintained constant and wherein said second sense circuit generates the strobe signal starting from the signal provided on the respective output line through a second output stage.

20. A method of controlling a memory device that includes an array of memory cells, the array including plural word lines and plural bit lines, the method comprising:
receiving a handshake signal;
generating a first enable signal in response to receiving the handshake signal, the first enable signal enabling precharging of a first one of the bit lines to bring the first bit line to a reference potential; and
generating a second enable signal in response to the first enable signal, the second enabling signal enabling turning on of a first one of the word lines, wherein the precharge and turning on steps are partially concurrent, wherein the step of generating the first enable signal generates a first edge of the first enable signal from an edge of the handshake signal indicating that a reading operation has started.

21. The method of claim 20, further comprising generating a second edge of the first enable signal from an edge of a signal indicating that the reading operation has finished.

22. The method of claim 20, further comprising:
generating a precharge signal from the first enable signal, the precharge signal precharging the first bit line; and
generating a reference precharge signal form the first enable signal, the reference precharge signal precharging a reference bit line.

23. The method of claim 22, further comprising:
generating a precharge disable signal from the reference precharge signal, the precharge disable signal causing the precharge signal to be disabled and enabling a value on the first bit line to be sensed.

24. The method of claim 23, further comprising keeping disabled the precharge signal until the handshake signal is re-enabled, which re-generates the first enable signal, which re-generates the precharge signal.

25. The method of claim 20 wherein the first enable signal is disabled in response to receiving a signal indicating an end of a reading operation and the first enable signal remains disabled until the handshake signal is re-enabled.

26. A memory controller for controlling a memory device that includes a memory cell array that includes plural word lines and plural bit lines, the memory controller comprising:
  means for generating a first enable signal in response to receiving a handshake signal, the first enable signal enabling precharging of a first one of the bit lines to bring the first bit line to a reference potential; and
  means for generating a second enable signal in response to the first enable signal, the second enabling signal enabling turning on of a first one of the word lines, wherein the precharge and turning on steps are partially concurrent, wherein the means for generating the first enable signal generates a first edge of the first enable signal from an edge of the handshake signal indicating that a reading operation has started.

27. The memory controller of claim 26, further comprising means for generating a second edge of the first enable signal from an edge of a signal indicating that the reading operation has finished.

28. The memory controller of claim 26, further comprising:
  means for generating a precharge signal form the first enable signal, the precharge signal precharging the first bit line; and
  means for generating a reference precharge signal form the first enable signal, the reference precharge signal precharging a reference bit line.

29. The memory controller of claim 28, further comprising:
  means for generating a precharge disable signal from the reference precharge signal, the precharge disable signal causing the precharge signal to be disabled and enabling a value on the first bit line to be sensed.

30. The memory controller of claim 29, further comprising means for keeping disabled the precharge signal until the handshake signal is re-enabled, which re-generates the first enable signal, which re-generates the precharge signal.

31. The memory controller of claim 26, further comprising:
  means for disabling the first enable signal in response to receiving a signal indicating an end of a reading operation; and
  means for keeping the first enable signal disabled until the handshake signal is re-enabled.

32. A memory device comprising:
  an array of memory cells, the array comprising a plurality of word lines and a plurality of bit lines; and
  means for managing reading operations for the array suitable to receive a handshake signal for starting said reading operations and carrying out a precharge step of the bit lines to bring them to a reference potential and a turning on step of the word lines for allowing access to the cells, wherein said managing means include a control block for generating a first enable signal of the precharge step and a second enable signal of the turning on step such that, within the same reading operation, the precharge and turning on steps are partially concurrent, wherein the control block is configured such that an edge of the second enable signal is at least partially activated during said precharge step, said second signal being such as to turn on the word lines at least after the precharge step has finished.

33. The memory device according to claim 32, wherein said control block comprises a handshake circuit such as to generate a first edge of the first enable signal from an edge of the handshake signal indicating that the reading operation has started.

34. The memory device according to claim 33, wherein said handshake circuit is such to generate a second edge of the first enable signal from an edge of a signal indicating that the reading operation has finished.

35. A method of controlling a memory device that includes an array of memory cells, the array including plural word lines and plural bit lines, the method comprising:
  receiving a handshake signal;
  generating a first enable signal in response to receiving the handshake signal, the first enable signal enabling precharging of a first one of the bit lines to bring the first bit line to a reference potential;
  generating a second enable signal in response to the first enable signal, the second enabling signal enabling turning on of a first one of the word lines, wherein the precharge and turning on steps are partially concurrent;
  generating a precharge signal from the first enable signal, the precharge signal precharging the first bit line; and
  generating a reference precharge signal form the first enable signal, the reference precharge signal precharging a reference bit line.

36. The method of claim 35, further comprising:
  generating a precharge disable signal from the reference precharge signal, the precharge disable signal causing the precharge signal to be disabled and enabling a value on the first bit line to be sensed.

37. The method of claim 36, further comprising keeping disabled the precharge signal until the handshake signal is re-enabled, which re-generates the first enable signal, which re-generates the precharge signal.

38. A method of controlling a memory device that includes an array of memory cells, the array including plural word lines and plural bit lines, the method comprising:
  receiving a handshake signal;
  generating a first enable signal in response to receiving the handshake signal, the first enable signal enabling precharging of a first one of the bit lines to bring the first bit line to a reference potential; and
  generating a second enable signal in response to the first enable signal, the second enabling signal enabling turning on of a first one of the word lines, wherein the precharge and turning on steps are partially concurrent, wherein the first enable signal is disabled in response to receiving a signal indicating an end of a reading operation and the first enable signal remains disabled until the handshake signal is re-enabled.

39. The method of claim 38, further comprising:
  generating a precharge signal from the first enable signal, the precharge signal precharging the first bit line; and
  generating a reference precharge signal form the first enable signal, the reference precharge signal precharging a reference bit line.

40. The method of claim 39, further comprising:
  generating a precharge disable signal from the reference precharge signal, the precharge disable signal causing the precharge signal to be disabled and enabling a value on the first bit line to be sensed.

41. A memory controller for controlling a memory device that includes a memory cell array that includes plural word lines and plural bit lines, the memory controller comprising:
  means for generating a first enable signal in response to receiving a handshake signal, the first enable signal enabling precharging of a first one of the bit lines to bring the first bit line to a reference potential;
  means for generating a second enable signal in response to the first enable signal, the second enabling signal enabling turning on of a first one of the word lines, wherein the precharge and turning on steps are partially concurrent;

means for generating a precharge signal form the first enable signal, the precharge signal precharging the first bit line; and means for generating a reference precharge signal form the first enable signal, the reference precharge signal precharging a reference bit line.

42. The memory controller of claim 41, further comprising:

means for generating a precharge disable signal from the reference precharge signal, the precharge disable signal causing the precharge signal to be disabled and enabling a value on the first bit line to be sensed.

43. The memory controller of claim 42, further comprising means for keeping disabled the precharge signal until the handshake signal is re-enabled, which re-generates the first enable signal, which re-generates the precharge signal.

44. A memory controller for controlling a memory device that includes a memory cell array that includes plural word lines and plural bit lines, the memory controller comprising:

means for generating a first enable signal in response to receiving a handshake signal, the first enable signal enabling precharging of a first one of the bit lines to bring the first bit line to a reference potential;

means for generating a second enable signal in response to the first enable signal, the second enabling signal enabling turning on of a first one of the word lines, wherein the precharge and turning on steps are partially concurrent;

means for disabling the first enable signal in response to receiving a signal indicating an end of a reading operation; and means for keeping the first enable signal disabled until the handshake signal is re-enabled.

45. The memory controller of claim 44, further comprising:

means for generating a precharge signal form the first enable signal, the precharge signal precharging the first bit line; and means for generating a reference precharge signal form the first enable signal, the reference precharge signal precharging a reference bit line.

46. The memory controller of claim 45, further comprising:

means for generating a precharge disable signal from the reference precharge signal, the precharge disable signal causing the precharge signal to be disabled and enabling a value on the first bit line to be sensed.

47. The memory controller of claim 46, further comprising means for keeping disabled the precharge signal until the handshake signal is re-enabled, which re-generates the first enable signal, which re-generates the precharge signal.

* * * * *

UNITED STATES PATENT AND TRADEMARK OFFICE
CERTIFICATE OF CORRECTION

PATENT NO. : 7,339,845 B2
APPLICATION NO. : 11/319799
DATED : March 4, 2008
INVENTOR(S) : Gianluca Blasi et al.

It is certified that error appears in the above-identified patent and that said Letters Patent is hereby corrected as shown below:

On the Title Page, item -57- Abstract
Line 1, "an" should read as -- and --

Column 11
Line 33, "staring" should read as -- starting --

Column 12
Line 52, "form" should read as -- from --

Column 13
Line 22, "form" should read as -- from --

Column 13
Line 25, "form" should read as -- from --

Column 14
Line 14, "the second enabling signal enabling" should read as -- the second enable signal enabling --

Column 14
Line 41, "the second enabling signal enabling" should read as -- the second enable signal enabling --

Column 14
Line 67, "the second enabling signal enabling" should read as -- the second enable signal enabling --

Column 15
Line 4, "form" should read as -- from --

Column 15
Line 7, "form" should read as -- from --

Column 15
Line 28, "the second enabling signal enabling" should read as -- the second enable signal enabling --

UNITED STATES PATENT AND TRADEMARK OFFICE
CERTIFICATE OF CORRECTION

PATENT NO.        : 7,339,845 B2
APPLICATION NO.   : 11/319799
DATED             : March 4, 2008
INVENTOR(S)       : Gianluca Blasi et al.

It is certified that error appears in the above-identified patent and that said Letters Patent is hereby corrected as shown below:

Column 16
Line 11, "form" should read as -- from --

Column 16
Line 14, "form" should read as -- from --

Signed and Sealed this

Twenty-ninth Day of July, 2008

JON W. DUDAS
*Director of the United States Patent and Trademark Office*